United States Patent
Hirota

(10) Patent No.: US 10,673,404 B2
(45) Date of Patent: Jun. 2, 2020

(54) RESONATOR AND RESONATION DEVICE

(71) Applicant: Murata Manufacturing Co., Ltd., Nagaokakyo-shi, Kyoto-fu (JP)

(72) Inventor: Wakana Hirota, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 344 days.

(21) Appl. No.: 15/898,300

(22) Filed: Feb. 16, 2018

(65) Prior Publication Data
US 2018/0175824 A1 Jun. 21, 2018

Related U.S. Application Data

(63) Continuation of application No. PCT/JP2016/070114, filed on Jul. 7, 2016.

(30) Foreign Application Priority Data

Sep. 18, 2015 (JP) .................................. 2015-185890

(51) Int. Cl.
H03H 9/21 (2006.01)
H03H 9/05 (2006.01)
(Continued)

(52) U.S. Cl.
CPC ............ *H03H 9/0595* (2013.01); *H03H 9/10* (2013.01); *H03H 9/1057* (2013.01);
(Continued)

(58) Field of Classification Search
CPC .. B06B 1/0659; H03H 3/04; H03H 2003/026; H03H 2003/0492; H03H 9/21;
(Continued)

(56) References Cited

U.S. PATENT DOCUMENTS 8,304,968 B2 * 11/2012 Tanaya ................ H03H 9/0514
310/370
10,594,259 B2 * 3/2020 Kawashima ............ H03H 9/05
(Continued)

FOREIGN PATENT DOCUMENTS

JP S49-18470 U 2/1974
JP S54-37488 A 3/1979
(Continued)

OTHER PUBLICATIONS

International Search Report issued for PCT/JP2016/070114, dated Oct. 4, 2016.
(Continued)

*Primary Examiner* — J. San Martin
(74) *Attorney, Agent, or Firm* — Arent Fox LLP

(57) ABSTRACT

A resonator includes a vibration portion with a base and a plurality of vibration arms each having a fixed end and a free end with the fixed end being connected to the base. Each of the plurality of vibration arms includes a piezoelectric thin film and an electrode stacked on the piezoelectric thin film. Moreover, a width of each of the plurality of vibration arms increases from the fixed end toward the free end. In addition, a width of the electrode of each of the plurality of vibration arms increases from the fixed end towards the free end of the vibration arm.

20 Claims, 9 Drawing Sheets

(51) Int. Cl.
*H03H 9/10* (2006.01)
*H03H 9/24* (2006.01)
*H03H 9/215* (2006.01)
*H03H 9/15* (2006.01)

(52) U.S. Cl.
CPC .......... *H03H 9/215* (2013.01); *H03H 9/2489* (2013.01); *H03H 2009/155* (2013.01)

(58) Field of Classification Search
CPC .... H03H 9/215; H03H 9/2468; H03H 9/2473; H03H 9/2484; H03H 9/2494; H03H 9/2478; H03H 9/2489
See application file for complete search history.

(56) References Cited

U.S. PATENT DOCUMENTS

2006/0066185 A1* 3/2006 Tanaya ............... G01C 19/5607
310/370
2011/0227458 A1* 9/2011 Tanaya ................. H03H 9/1021
310/344
2015/0137901 A1* 5/2015 Yamada ................. H03H 9/215
331/156
2016/0072473 A1 3/2016 Nishimura et al.

FOREIGN PATENT DOCUMENTS

| | | |
|---|---|---|
| JP | S56-105926 U | 8/1981 |
| JP | 2015-88762 A | 5/2015 |
| WO | WO 2014/185282 A1 | 11/2014 |

OTHER PUBLICATIONS

Written Opinion of the International Searching Authority issued for PCT/JP2016/070114, dated Oct. 4, 2016.

* cited by examiner

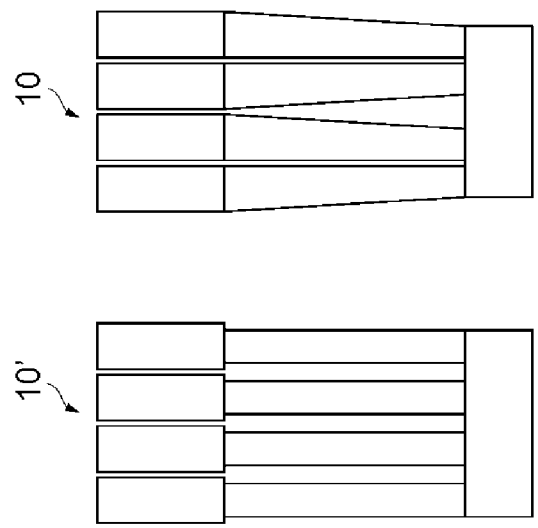
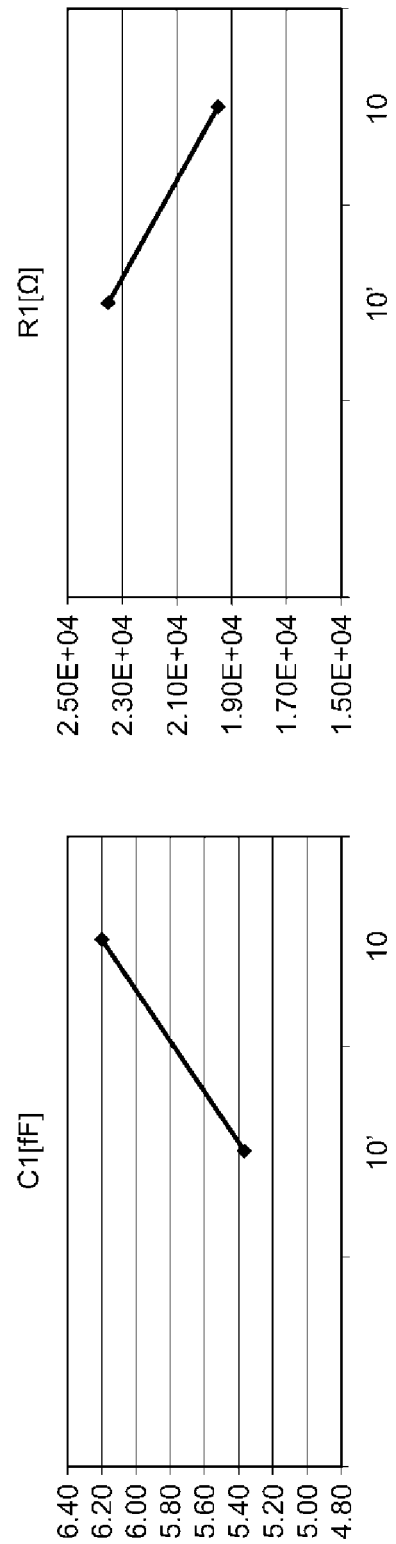
FIG. 5(A)
FIG. 5(B)

RESONATOR AND RESONATION DEVICE

CROSS REFERENCE TO RELATED APPLICATIONS

The present application is a continuation of PCT/JP2016/070114 filed Jul. 7, 2016, which claims priority to Japanese Patent Application No. 2015-185890, filed Sep. 18, 2015, the entire contents of each of which are incorporated herein by reference.

TECHNICAL FIELD

The present disclosure relates to a resonator and a resonation device in which a plurality of vibration arms vibrate in an out-of-plane bending vibration mode.

BACKGROUND

Currently, resonation devices utilizing MEMS (Microelectromechanical Systems) technology have been used as timing devices, for example. Such resonation devices are mounted on a printed circuit board of an electronic device, such as a smartphone. These resonation devices include a lower substrate, an upper substrate that forms a cavity between the lower substrate and the upper substrate, and a resonator disposed in the cavity between the lower substrate and the upper substrate.

An existing resonator including a plurality of vibration arms is disclosed, for example, in Patent Document (identified below). In the resonator disclosed in Patent Document 1, each of the vibration arms has an elongated shape, an end of the vibration arm near a base is a fixed end, and an end of the vibration arm away from the base is a free end. A mass portion (e.g., a hammer head or weight) is formed at the tip of the free end of the vibration arm. The mass portion has a larger cross-sectional area than a part of the vibration arm near the base. With the resonator described in Patent Document 1, by increasing the mass of the tip of the vibration arm, the frequency of bending vibration of the vibration arm can reduced, the length of the vibration arm can be reduced, and the size of the resonator can be reduced while maintaining a desired frequency value.

Patent Document 1: Japanese Unexamined Patent Application Publication No. 2012-105044.

However, as described in Patent Document 1, the capacitance of the resonator is reduced because the hammer head is formed at the free end of the vibration arm. As a result, the resonant resistance increases, and the oscillation efficiency of an oscillation circuit is reduced.

SUMMARY OF THE INVENTION

Thus, an object of the present disclosure is to reduce the size of a resonator while maintaining the oscillation efficiency of an oscillation circuit.

According to an exemplary aspect of the present disclosure, a resonator includes a vibration portion including a base and a plurality of vibration arms each of which has a first end and a second end, the first end being connected to the base. Each of the plurality of vibration arms includes a piezoelectric thin film and an electrode stacked on the piezoelectric thin film. A width of each of the plurality of vibration arms increases from the first end toward the second end. A width of the electrode of each of the plurality of vibration arms increases from the first end toward the second end of the vibration arm.

In the resonator, since the width of each of the vibration arms gradually increases from the fixed end toward the free end, the weight per unit length of a part of each of the vibration arms near the free end is greater than that of a part of the vibration arm near the fixed end. Thus, the amplitude of vibration of each of the vibration arms in the up-down direction can be increased without changing the length of the vibration arm. Moreover, since the width of the electrode on each of the vibration arms gradually increases from the fixed end toward the free end, the electrode area of each of the vibration arms can be increased and the capacitance of the resonator can be increased. Thus, resonant resistance can be reduced. As a result, the size of the resonator can be reduced while maintaining the oscillation efficiency of an oscillation circuit.

Preferably, the first ends of the plurality of vibration arms are connected to a first side of the base, and the plurality of vibration arms extend in a first direction that is substantially perpendicular to the first side. Moreover, the resonator preferably further includes a frame disposed in at least a part of a region surrounding the vibration portion; and a holding arm that is disposed between the vibration portion and the frame and that connects the base and the frame to each other. In this case, since the vibration portion is held by the frame via the holding arm, a moment in a rotational direction generated in the vibration portion can be dispersed, and variation in the vibration frequency of the resonator can be reduced.

Preferably, each of the plurality of vibration arms includes a first arm and a second arm adjacent to the first arm; where the first arm has a first side and a second side that define the width of the first arm, and, from the first end toward the second end, a distance by which the first side becomes displaced in a second direction that is perpendicular to the first direction is smaller than a distance by which the second side becomes displaced in the second direction; the second arm has a third side and a fourth side that define the width of the second arm, and, from the first end toward the second end, a distance by which the third side becomes displaced in the second direction is smaller than a distance by which the fourth side becomes displaced in the second direction; and the first side and the third side face each other. Preferably, a distance between the first side and the third side is substantially uniform from the first ends of the first arm and the second arm to the second ends of the first arm and the second arm.

In this case, the vibration arms are structured so that the distance by which adjacent long sides become displaced in the second direction is smaller than the distance by which nonadjacent long sides become displaced in the second direction. As a result, even in the case where each of the vibration arms is structured so that the width thereof gradually increases from the fixed end toward the free end, the width between the vibration arms near the fixed end can be reduced. Thus, the charge density of the vibration arms near the fixed end can be increased, and coupling coefficient related to vibration of the adjacent vibration arms can be improved.

Moreover, a resonation device according to an exemplary aspect of the present disclosure can include any one of the resonators described above.

In the resonation device, since the width of each of the vibration arms gradually increases from the fixed end toward the free end, the weight per unit length of a part of each of the vibration arms near the free end is greater than that of a part of each of the vibration arms near the fixed end. Thus, the amplitude of vibration of each of the vibration arms in the up-down direction can be increased without changing the length of the vibration arm. Moreover, since the width of the electrode on each of the vibration arms gradually increases from the fixed end toward the free end, the electrode area of each of the vibration arms can be increased and the capacitance of the resonator can be increased. Thus, resonant resistance can be reduced. As a result, the size of the resonator can be reduced while maintaining the oscillation efficiency of an oscillation circuit.

With the exemplary embodiments of the present disclosure, the size of a resonator can be reduced while maintaining the oscillation efficiency of an oscillation circuit.

BRIEF DESCRIPTION OF DRAWINGS

FIGS. 5(A) and 5(B) illustrate graphs in which capacitance and resonant resistance are compared between the resonator according to the first exemplary embodiment and an existing resonator.

DETAILED DESCRIPTION OF EMBODIMENTS

First Embodiment

Figure 1:
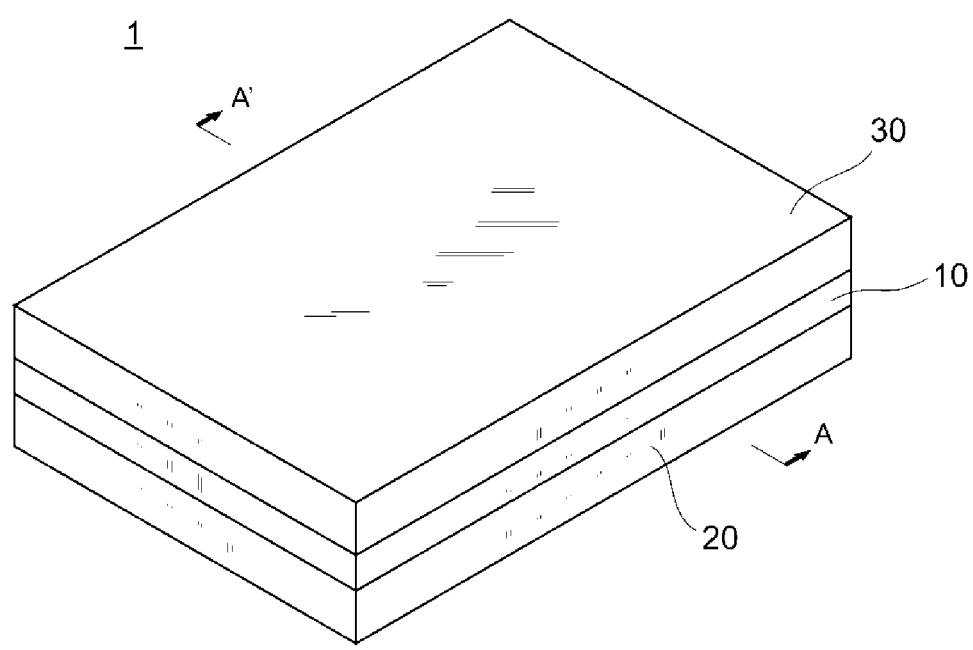
FIG. 1 is an external perspective view schematically illustrating the external appearance of a resonation device according to a first exemplary embodiment.
Figure 2:
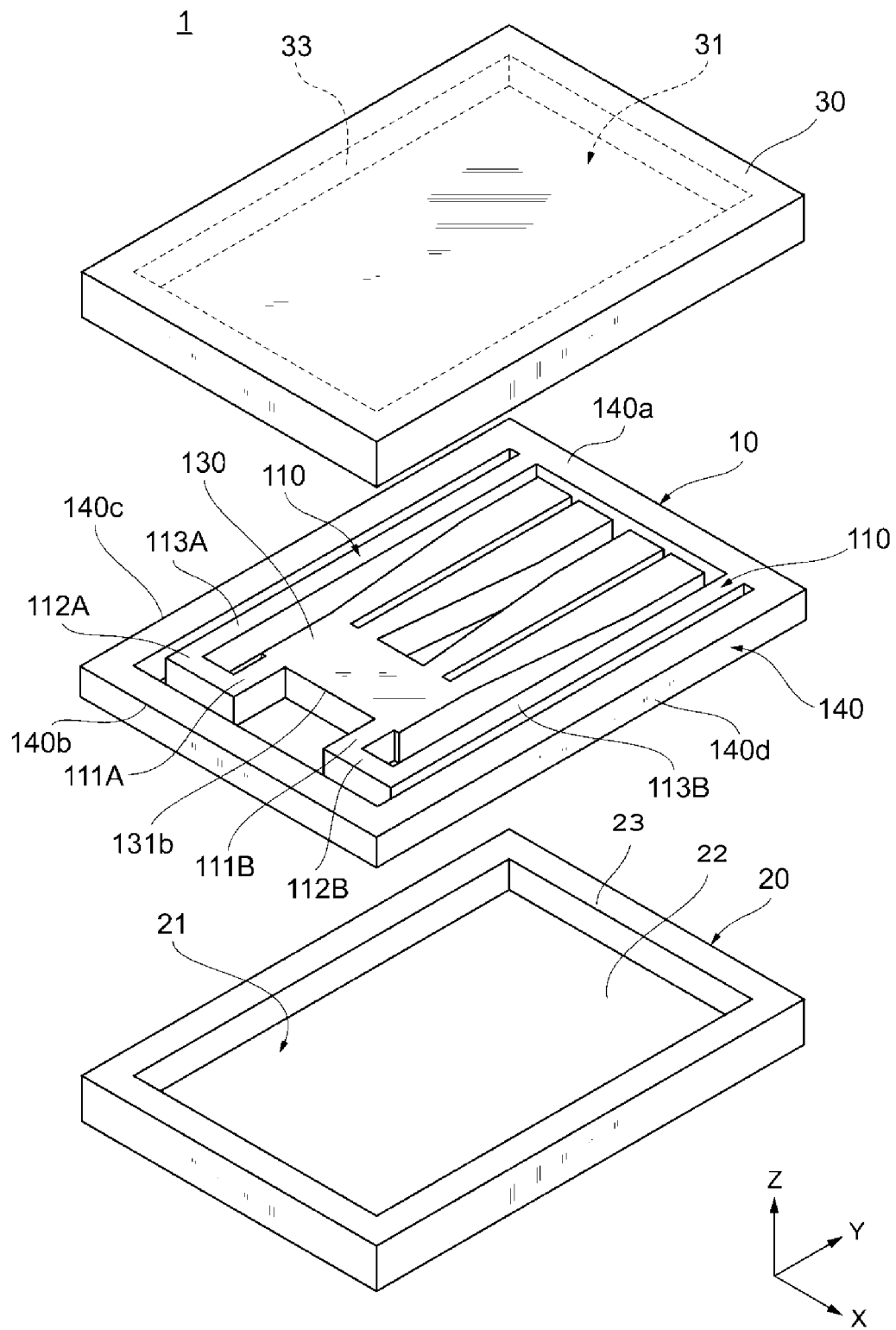
FIG. 2 is an exploded perspective view schematically illustrating the structure of the resonation device according to the first exemplary embodiment.

Hereinafter, a first exemplary embodiment of will be described with reference to the drawings. FIG. 1 is an external perspective view schematically illustrating the external appearance of a resonation device 1 according to the first exemplary embodiment. FIG. 2 is an exploded perspective view schematically illustrating the structure of the resonation device 1 according to the first exemplary embodiment.

The resonation device 1 includes a resonator 10, and an upper cover 30 and a lower cover 20 between which the resonator 10 is disposed. That is, the resonation device 1 is formed by stacking the lower cover 20, the resonator 10, and the upper cover 30 in this order.

The resonator 10, the lower cover 20, and the upper cover 30 are joined to each other, thereby sealing the resonator 10 and forming a vibration space in which the resonator 10 vibrates. The resonator 10, the lower cover 20, and the upper cover 30 are each made from a Si substrate according to an exemplary aspect. Moreover, the resonator 10, the lower cover 20, and the upper cover 30 are joined to each other by joining the Si substrates to each other. The resonator 10 and the lower cover 20 each may be made from a SOI substrate.

The resonator 10 is a MEMS resonator manufactured by using MEMS technology. The resonator 10 may be a quartz crystal resonator. Hereinafter, elements of the resonation device 1 will be described in detail.

(1. Upper Cover 30)

The upper cover 30 extends along the XY-plane and has a recess 31 in a back surface thereof. The recess 31 has, for example, a low-profile rectangular-parallelepiped shape. The recess 31 is surrounded by a side wall 33 and forms a part of a vibration space in which the resonator 10 vibrates.

(2. Lower Cover 20)

The lower cover 20 includes a bottom plate 22, which has a flat plate-like shape extending along the XY-plane; and a side wall 23, which extends in the Z-axis direction (that is, the direction in which the lower cover 20 and the resonator 10 are stacked) from a peripheral part of the bottom plate 22. In a surface of the lower cover 20 facing the resonator 10, a recess 21, which is defined by a surface of the bottom plate 22 and an inner surface of the side wall 23, is formed. The recess 21 forms a part of a vibration space of the resonator 10. The upper cover 30 described above and the lower cover 20 hermetically seal the vibration space and maintain a vacuum state of the vibration space. The vibration space may be filled with a gas, such as an inert gas.

(3. Resonator 10)

The resonator 10 includes a vibration portion 120, a holding portion 140, and holding arms 110.

(a) Vibration Portion 120

Figure 3:
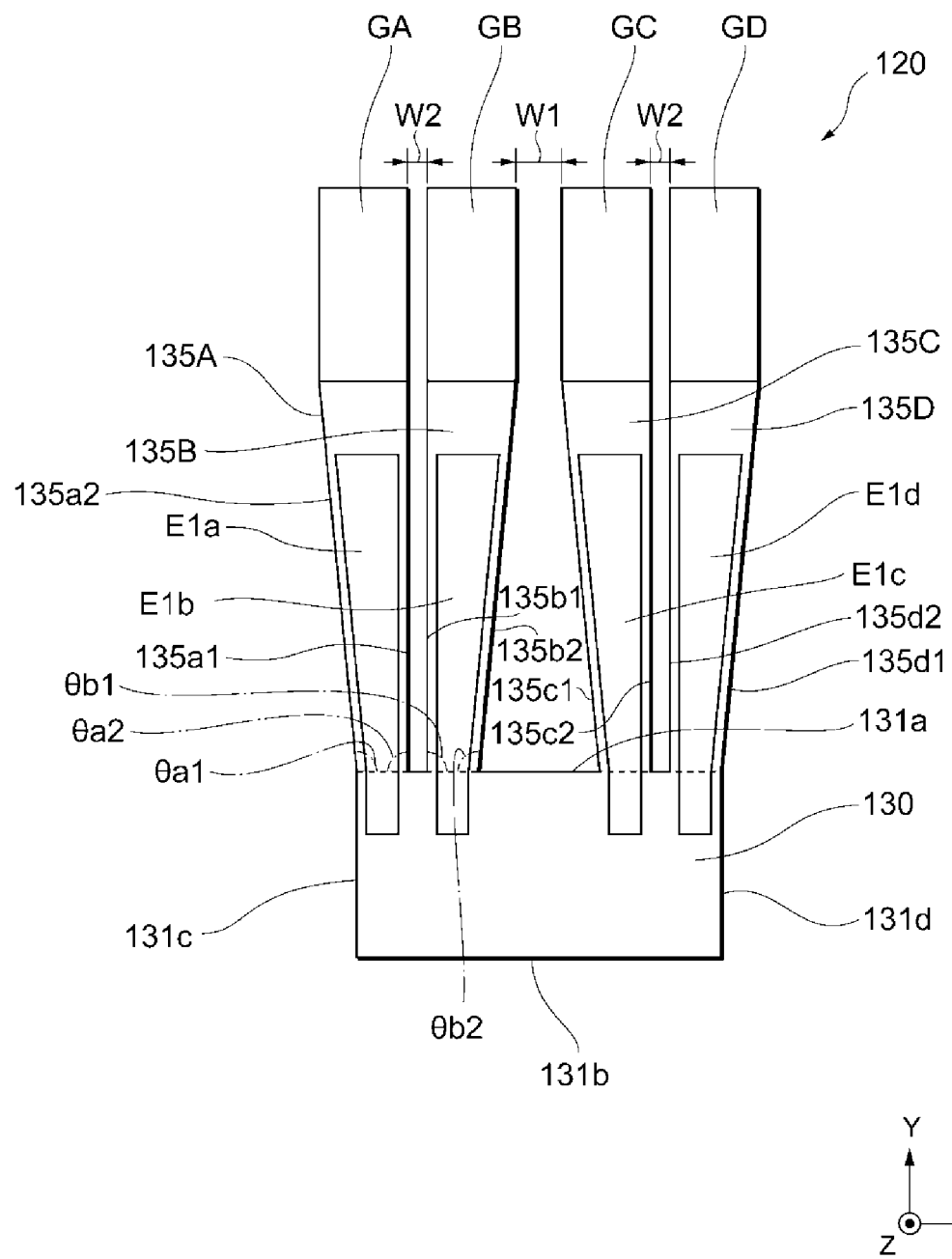
FIG. 3 is a plan view of the resonator according to the first exemplary embodiment from which an upper cover is removed.

FIG. 3 is a plan view schematically illustrating the structure of the vibration portion 120 according to the present embodiment. Referring to FIG. 3, the structure of the vibration portion 120 according to the present embodiment will be described.

The vibration portion 120 (i.e., a "vibrator" or "piezoelectric vibrator") has a flat plate-like outer shape that extends two-dimensionally along the XY-plane of the orthogonal coordinate system shown in FIG. 3. The vibration portion 120 is disposed inside the holding portion 140 (i.e., a "frame" or "retainer"), and a space is formed between the vibration portion 120 and the holding portion 140 with a predetermined distance. In the example shown in FIG. 3, the vibration portion 120 includes a base 130 and four vibration arms 135A to 135D. It should be appreciated that the number of vibration arms is not limited to four and may be any appropriate number that is, for example, three or more.

According to the exemplary embodiment, the base 130 is a substantially rectangular-parallelepiped plate having a long side 131a (an example of a first side) and a long side 131b, which extend in the X-axis direction (an example of a first direction), and a short side 131c and a short side 131d, which extend in the Y-axis direction. In the example shown in FIG. 3, the long side 131b of the base 130 is connected to the holding portion 140 via the holding arms 110 as described below, and the base 130 is held by the holding portion 140. The base 130 may be held by the holding portion 140 not by using the holding arms 110 but by directly connecting the long side 131b of the base 130 to the frame member 140b of the holding portion 140. In the exemplary embodiment, the width of the base 130 in the X-axis direction is about 260 μm, and the length of the base 130 in the Y-axis direction is about 50 μm. it is noted that the shape of the base 130 is not limited to a rectangular parallelepiped and may be any shape that is substantially symmetric about a plane defined along a perpendicular bisector of the long side 131a. For example, the base 130 may have a trapezoidal shape such that the long side 131b is shorter than the long side 131a, or the long side 131b may be an arc-shaped curve.

Each of the vibration arms 135A to 135D is disposed between the base 130 and the holding portion 140 so as to extend in a direction parallel to the Y-axis direction (an example of a second direction). Each of the vibration arms 135A to 135D has a first end, which is a fixed end connected to the long side 131a of the base 130; and a second end, which is a free end. In the present embodiment, the vibration arms 135A to 135D are integrally formed with the base 130. Upper electrodes E1a to E1d are respectively disposed on the vibration arms 135A to 135D. The upper electrodes E1a to E1d are formed over the vibration arms 135A to 135D and the base 130. In the present embodiment, when an alternating-current signal is applied between the upper electrode E1a and the upper electrode E1b, the vibration arms 135A and 135B perform out-of-plane bending vibrations in opposite phases. Likewise, when an alternating-current signal is applied between the upper electrode E1c and the upper electrode E1d, the vibration arms 135C and 135D perform out-of-plane bending vibrations in opposite phases.

In the exemplary aspect, the width in the X-axis direction of each of the vibration arms 135A to 135D and the upper electrodes E1a to E1d gradually increases from the fixed end toward the free end. For example, the width each of the vibration arms 135A to 135D in the X-axis direction is about 40 μm near the fixed end and is about 60 μm near the free end. The length of each of the vibration arms 135A to 135D in the Y-axis direction is about 270 μm.

Since the width of each of the vibration arms 135A to 135D in the X-axis direction gradually increases from the fixed end toward the free end, the weight per unit length of a part of each of the vibration arms 135A to 135D near the free end is greater than that of a part of each of the vibration arms 135A to 135D near the fixed end. Thus, the amplitude of vibration of each of the vibration arms in the up-down direction can be advantageously increased.

Moreover, since the width of each of the upper electrodes E1a to E1d in the X-axis direction gradually increases from the fixed end toward the free end, the electrode area of each of the vibration arms 135A to 135D can be increased and the capacitance of the resonator 10 can be increased. Thus, resonant resistance can be reduced, and the efficiency of vibration can be also increased.

As illustrated in FIG. 3, in the vibration portion 120 according to the present embodiment, two vibration arms 135A and 135D (e.g., "outer arms") are disposed in outer parts of the vibration portion 120 in the X-axis direction, and two vibration arms 135B and 135C (e.g., "inner arms") are disposed in inner parts of the vibration portion 120 in the X-axis direction. The distance W1 in the X-axis direction between the vibration arms 135B and 135C is greater than the distance W2 in the X-axis direction between the outer vibration arm 135A (135D) and the inner vibration arm 135B (135C) adjacent to the outer vibration arm 135A (135D). For example, the distance W1 is about 25 μm and the distance W2 is about 5 μm. By setting the distance W2 smaller than the distance W1, vibration characteristics are improved. The distance W1 may be smaller than or equal to the distance W2 in order that the size of the resonation device 1 can be reduced.

Preferably, the vibration arm 135A has a shape that is laterally asymmetric about a center line extending in the Y-axis direction. To be specific, the vibration arm 135A (an example of a first arm) has a long side 135a1 (an example of a first side), which faces the vibration arm 135B (an example of a second arm) in the X-axis direction; and a long side 135a2 (an example of a second side), which faces the frame member 140c. The angle θa1 between the long side 131a of the base 130 and the long side 135a1 of the vibration arm 135A is smaller than the angle θa2 between the long side 131a and the long side 135a2 of the vibration arm 135A. In other words, the inclination of the long side 135a1 relative to the X axis is smaller than the inclination of the long side 135a2 relative to the X axis.

Preferably, the vibration arm 135B has a shape that is laterally asymmetric about a center line extending in the Y-axis direction. To be specific, the vibration arm 135B has a long side 135b1 (an example of a third side), which faces the vibration arm 135A in the X-axis direction; and a long side 135b2 (an example of a fourth side), which faces the vibration arm 135C. The angle θb1 between the long side 131a of the base 130 and the long side 135b1 of the vibration arm 135B is smaller than the angle θb2 between the long side 131a and the long side 135b2 of the vibration arm 135B. In other words, the inclination of the long side 135b1 relative to the X axis is smaller than the inclination of the long side 135b2 relative to the X axis.

As described above, the vibration arms 135A and 135B according to the present embodiment are structured so that the inclinations of the adjacent long sides 135a1 and 135b1 relative to the X axis are smaller than the inclinations of the non-adjacent long sides 135a2 and 135b2 relative to the X axis. As a result, even in the case where each of the vibration arms 135A and 135B is structured so that the width thereof gradually increases from the fixed end toward the free end, the distance W2 between the vibration arms 135A and 135B near the fixed end can be reduced. Thus, the charge density of the vibration arms 135A and 135B near the fixed end can be increased, and the coupling coefficient related to vibrations of the outer and inner vibration arms can be improved. Moreover, the size of the resonator 10 can be advantageously reduced while maintaining the vibration efficiency of an oscillation circuit.

The inclinations of the long sides 135a1 and 135b1 of the vibration arms 135A and 135B relative to the X axis need not be smaller than the inclinations of the long sides 135a2 and 135b2 relative to the X axis. For example, a distance in the Y-axis direction by which each of the adjacent long sides 135a1 and 135b1 becomes displaced from the fixed end toward the free end may be greater than that of each of the long sides 135a2 and 135b2. In this case, the inclinations of the long sides 135a1 and 135b1 near the fixed end of the vibration arms 135A and 135B may be the same as the inclinations of the long sides 135a2 and 135b2 near the fixed end.

The vibration arms 135C and 135D have structures and advantages that are the same as those of the vibration arms 135A and 135B and will not be repeated herein.

According to the exemplary aspect, the vibration arms 135A to 135D respectively have weight portions GA to GD at the free ends thereof. The width of each of the weight portions GA to GD in the X-axis direction is the same as the width of the free end of a corresponding one of the vibration arms 135A to 135D in the X-axis direction. For example, the width of each of the weight portions GA to GD in the X-axis direction is about 60 μm, and the length of each of the weight portions GA to GC in the Y-axis direction is about 150 μm.

For example, the weight portions GA to GD are integrally formed with the vibration arms 135A to 135D through the same process. Since the weight portions GA to GD are formed, the weight per unit length of each of the vibration arms 135A to 135D near the free end is greater than that near the fixed end. Accordingly, since the vibration arms 135A to 135D respectively have the weight portions GA to GD at the free ends thereof, the amplitude of vibration of each of the vibration arms in the up-down direction can be increased.

Referring back to FIG. 2, other elements of the resonator 10 will be described.

(b) Holding Portion 140

The holding portion 140 (i.e., the "frame" or "retainer") has a rectangular frame-like shape extending along the XY-plane. The holding portion 140 surrounds the outer periphery of the vibration portion 120 along the XY-plane. The holding portion 140 may be present in at least a part of a region surrounding the vibration portion 120, and the shape of the holding portion 140 is not limited to a frame-like shape.

In the present embodiment, the holding portion 140 includes, for example, frame members 140a to 140d, each of which has a rectangular columnar shape. As shown, the frame members 140a to 140d can be integrally formed. The frame member 140a faces the free ends of the vibration arms 135A to 135D and extends in the X-axis direction. The frame member 140b faces the long side 131b of the base 130 and extends in the X-axis direction. The frame member 140c faces a long side of the vibration arm 135A, extends in the Y-axis direction, and is connected to first ends of the frame members 140a and 140b at respective ends thereof. The frame member 140d faces a long side of the vibration arm 135D, extends in the Y-axis direction, and is connected to second ends of the frame members 140a and 140b at respective ends thereof.

(c) Holding Arms 110

The holding arms 110 are disposed between the vibration portion 120 and the holding portion 140. For example, the holding arms 110 connect the long side 131b of the base 130 and frame member 140a to each other. As illustrated in FIG. 2 and FIG. 3, the holding arms 110 are substantially symmetric about an imaginary plane that is defined parallel to the YZ plane along a center line of the base 130 in the X-axis direction. The vibration portion 120 is held by the holding portion 140 via the holding arms 110, and thereby attenuation of vibration generated by the vibration portion 120 can be reduced. In an alternative aspect, the resonator 10 may not include the holding arms 110, and the long side 131b of the base 130 may be directly connected to the frame member 140b of the holding portion 140. The holding arms 110 may be connected to another frame member of the holding portion 140.

In the present embodiment, the pair of holding arms 110 include arms 111A to 113A and 111B to 113B, respectively. A first end of each of the holding arms 110 is connected to the long side 131b of the base 130, and the holding arm 110 extends toward the frame member 140b from the first end. Each of the holding arms 110 is bent in the X-axis direction, further bent in the Y-axis direction, and a second end of each of the holding arms 110 is connected to the frame member 140a.

The arm 111A is disposed between the base 130 and the frame member 140b so that the arm 111A faces the frame member 140c and so that the longitudinal direction thereof is parallel to the Y axis. A first end of the arm 111A is connected to the base 130 at the long side 131b of the base 130, and the arm 111A extends from the first end in a direction perpendicular to the long side 131b, that is, the Y-axis direction. Preferably, an axis extending through the center of the arm 111A in the X-axis direction is located inside of the center line of the vibration arm 135A. In the example shown in FIG. 3, the arm 111A is disposed between the vibration arms 135A and 135B. A second end of the arm 111A is connected to the first end of the arm 112A at a side surface thereof. The width of the arm 111A in the X-axis direction is about 20 μm, and the width of the arm 111A in the Y-axis direction is about 40 μm.

The arm 112A is disposed between the base 130 and the frame member 140b so that the arm 112A faces the frame member 140b and so that the longitudinal direction thereof is parallel to the X-axis direction. A first end of the arm 112A is connected to the side surface of the second end of the arm 111A facing the frame member 140c, and the arm 112A extends from the first end in a direction substantially perpendicular to the arm 111A, that is, the X-axis direction. A second end of the arm 112A is connected to a side surface of a first end of the arm 113A that faces the vibration portion 120. For example, the width of the arm 112A in the Y-axis direction is about 20 μm, and the width of the arm 112A in the X-axis direction is about 80 μm.

The arm 113A is disposed between the base 130 and the frame member 140c so that the arm 113A faces the frame member 140c and so that the longitudinal direction of the arm 113A is parallel to the Y-axis direction. A first end of the arm 113A is connected to the second end of the arm 112A at a side surface thereof. A second end of the arm 113A is connected to a part the frame member 140a outside of a position facing the vibration portion 120, and the arm 113A extends from the position in a direction substantially perpendicular to the frame member 140a, that is, the Y-axis direction. For example, the width of the arm 113A in the X-axis direction is about 20 μm, and the length of the arm 113A in the Y-axis direction is about 700 μm. The arms 111B to 113B have structures that are the same as those of the arms 111A to 113A.

(4. Stack Structure)

Figure 4:
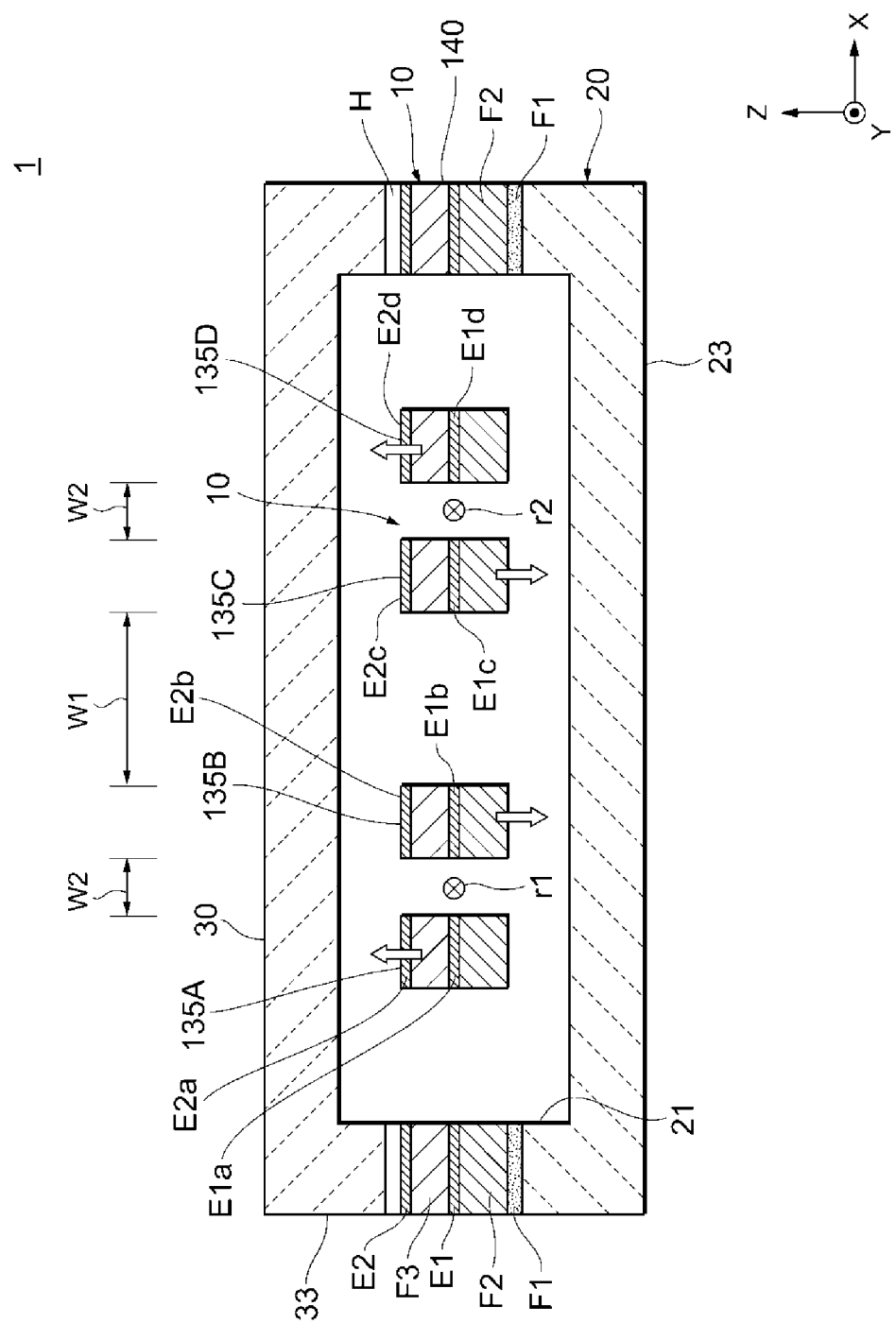
FIG. 4 is a sectional view taken along line A-A' of FIG. 1.

Referring to FIG. 4, the stack structure of the resonation device 1 will be described. FIG. 4 is a sectional view taken along line AA' of FIG. 1.

As illustrated in FIG. 4, in the resonation device 1 according to the present embodiment, the holding portion 140 of the resonator 10 is joined onto the side wall 23 of the lower cover 20, and the holding portion 140 of the resonator 10 is joined to the side wall 33 of the upper cover 30. Thus, the resonator 10 is held between the lower cover 20 and the upper cover 30; and the lower cover 20, the upper cover 30, and the holding portion 140 of the resonator 10 form a vibration space in which the vibration arms 135A to 135D vibrate.

The bottom plate 22 and the side wall 23 of the lower cover 20 are integrally formed from Si (silicon). A silicon oxide (for example, SiO2 (silicon dioxide)) film F1 is formed on the upper surface of the side wall 23. The lower cover 20 and the holding portion 140 of the resonator 10 are joined to each other via the silicon oxide film F1. For example, the thickness of the lower cover 20 in the Z-axis direction is 150 μm and the depth of the recess 21 is 50 μm.

The upper cover 30 is made from a Si (silicon) wafer having a predetermined thickness. As illustrated in FIG. 4, the upper cover 30 is joined to the holding portion 140 of the resonator 10 at a peripheral side portion (the side wall 33) thereof. A joint portion H is formed between a peripheral part of the upper cover 30 and the holding portion 140 in order to join the upper cover 30 and the holding portion 140 to each other. The joint portion H is made of, for example, a Au (gold) film and a Sn (tin) film.

The holding portion 140, the base 130, the vibration arms 135A to 135D, and the holding arms 110 of the resonator 10 are made through the same process. In the resonator 10, first, a metal layer E2 is stacked on a Si (silicon) layer F2. A piezoelectric thin film F3 is stacked on the metal layer E2 so as to cover the metal layer E2, and a metal layer E1 is stacked on the piezoelectric thin film F3.

The Si layer F2 is made from, for example, an n-type degenerate Si semiconductor having a thickness of about 10 µm, which may include P (phosphorous), As (arsenic), Sb (antimony), or the like as an n-type dopant. Preferably, the resistance of degenerate Si used for the Si layer F2 is 0.5 mΩ·cm or higher and 0.9 m Ω·cm or lower. A silicon oxide (for example, SiO2) layer F'2 may be formed on the lower surface of the Si layer F2. In this case, temperature characteristics can be improved.

The metal layers E1 and E2 are made from, for example, Mo (molybdenum) or aluminum (Al) having a thickness of about 0.1 µm. By using degenerate silicon as the Si layer F2, the Si layer F2 can also serve as the metal layer E1.

Each of the metal layers E1 and E2 is formed so as to have a desired shape by etching or the like. For example, on the vibration portion 120, the metal layer E2 is formed so as to function as lower electrodes E2a, E2b, E2c, and E2d. On the holding arms 110 and the holding portion 140, the metal layer E2 is formed so as to function as wiring for connecting the lower electrodes to an alternating-current power source disposed outside the resonator 10.

On the vibration portion 120, the metal layer E1 is formed so as to function as upper electrodes E1a, E1b, E1c, and E1d. On the holding arms 110 and the holding portion 140, the metal layer E1 is formed so as to function as wiring for connecting the upper electrodes to the alternating-current power source disposed outside the resonator 10.

The alternating-current power source may be connected to the lower wiring or the upper wiring by using any of the following structures: a structure in which an electrode is formed on the outer surface of the upper cover 30, and the electrode connects the alternating-current power source to the lower wiring or the upper wiring; and a structure in which vias are formed in the upper cover 30, wiring is formed in each of the via by filling the inside of the via with an electroconductive material, and the wiring connects the alternating-current power source to the lower wiring or the upper wiring.

The piezoelectric thin film F3 is a thin film of a piezoelectric material that converts an applied electric voltage into vibration. The piezoelectric thin film F3 may be mainly composed of, for example, a nitride, such as AlN (aluminum nitride), or an oxide. To be specific, the piezoelectric thin film F3 may be made of ScAlN (scandium aluminum nitride). ScALN is a substance in which some of aluminum atoms in aluminum nitride are replaced with scandium atoms. The piezoelectric thin film F3 has a thickness of, for example, 1 µm.

The piezoelectric thin film F3 extends and contracts in an in-plane direction of the XY-plane, that is, in the Y-axis direction in accordance with an electric field applied to the piezoelectric thin film F3 by the metal layers E2 and E1. The extension and contraction of the piezoelectric thin film F3 causes the free ends of the vibration arms 135A to 135D to become displaced toward an inner surface of the lower cover 20 and an inner surface of the upper cover 30, so that the vibration arms 135A to 135D vibrate in an out-of-plane bending vibration mode.

In the present embodiment, as illustrated in FIG. 4, the phase of electric fields applied to the outer vibration arms 135A and 135D and the phase of electric fields applied to the inner vibration arms 135B and 135C are opposite to each other. Thus, the outer vibration arms 135A and 135D and the inner vibration arms 135B and 135C become displaced in opposite directions during excitation. For example, when the free ends of the outer vibration arms 135A and 135D become displaced toward the inner surface of the upper cover 30, the free ends of the inner vibration arms 135B and 135C become displaced toward the inner surface of the lower cover 20.

With the resonating device 1, when performing opposite-phase vibration, the vibration arm 135A and the vibration arm 135B vibrate in opposite up-down directions (i.e., in the Z axis) around a central axis r1 extending parallel to the Y axis in a space between the vibration arm 135A and the vibration arm 135B as shown in FIG. 4. The vibration arm 135C and the vibration arm 135D vibrate in opposite up-down directions (i.e., in the Z axis) around a central axis r2 extending parallel to the Y axis in a space between the vibration arm 135C and the vibration arm 135D. Thus, torsion moments in opposite directions are generated around the central axes r1 and r2, so that the base 130 performs bending vibration.

According to the exemplary embodiment in which the resonator 10 includes the holding arms 110, since the vibration portion 120 is held by the holding portion 140 via the holding arms 110, a moment in a rotational direction generated in the vibration portion 120 can be dispersed, and variation in the vibration frequency of the resonator 10 can be reduced. Moreover, this effect can be further increased by forming the holding arms 110 so as to be bent.

FIGS. 5(A) and 5(B) show graphs in which capacitance and resonant resistance are compared between the resonator 10 according to the present exemplary embodiment and a resonator 10' according to a comparative example. In the example shown in FIGS. 5(A) and 5(B), the resonator 10' according to the comparative example is a resonator including four vibration arms each having a weight, which is similar to that of the resonator 10 according to the present embodiment, at the free end thereof. The width in the X-axis direction of each of the vibration arms of the resonator 10' is 40 µm, the length in the Y-axis direction of the vibration arm is 270 µm, and the distance W2 between an outer vibration arm and an inner vibration arm is 20 µm. The resonator 10 according to the present embodiment differs from the resonator 10' according to the comparative example in that the width of each of the vibration arms 135A to 135D of the resonator 10 gradually increases from the fixed end toward the free end, while the width of each of the vibration arms of the resonator 10' is uniform from the fixed end to the free end. The length of each of the vibration arms, the width of a part of each of the vibration arms near the fixed end, and the width and length of each of the weights do not differ between the resonator 10 and the resonator 10'.

More specifically, FIG. 5(A) is a graph in which capacitance is compared between the resonator 10 and the resonator 10'. As shown in FIG. 5(A), the capacitance of the resonator 10 according to the present embodiment is increased in comparison with the existing resonator 10'. In the resonator 10 according to the present embodiment, since the width of each of the vibration arms 135A to 135D increases from the fixed end toward the free end, the area of the upper electrode E1 and the area of the lower electrode E2 can be also increased. Thus, capacitance can be increased.

FIG. 5(B) is a graph in which resonant resistance is compared between the resonator 10 and the resonator 10'. As shown in FIG. 5(B), the resonant resistance of the resonator 10 according to the present embodiment is reduced in comparison with the resonator 10' because of larger capacitance. The width of each of the vibration arms 135A to 135D of the resonator 10 near the free end is the same as the width of a corresponding one of the weight portions GA to GD. Accordingly, the largest width of each of the vibration arms 135A to 135D of the resonator 10 is the same as the width of each of the weights of the resonator 10' according to the comparative example. Therefore, the resonator 10 and the resonator 10' do not differ in the entire size. As a result, the size of the resonator 10 according to the present embodiment can be reduced while maintaining the oscillation efficiency of an oscillation circuit.

Second Embodiment

In the second to fifth exemplary embodiments, descriptions of matters common to the first exemplary embodiment will be omitted, and differences from the first exemplary embodiment will only be described. In particular, similar advantages due to similar structures will not be specifically described in each of the embodiments.

Figure 6:
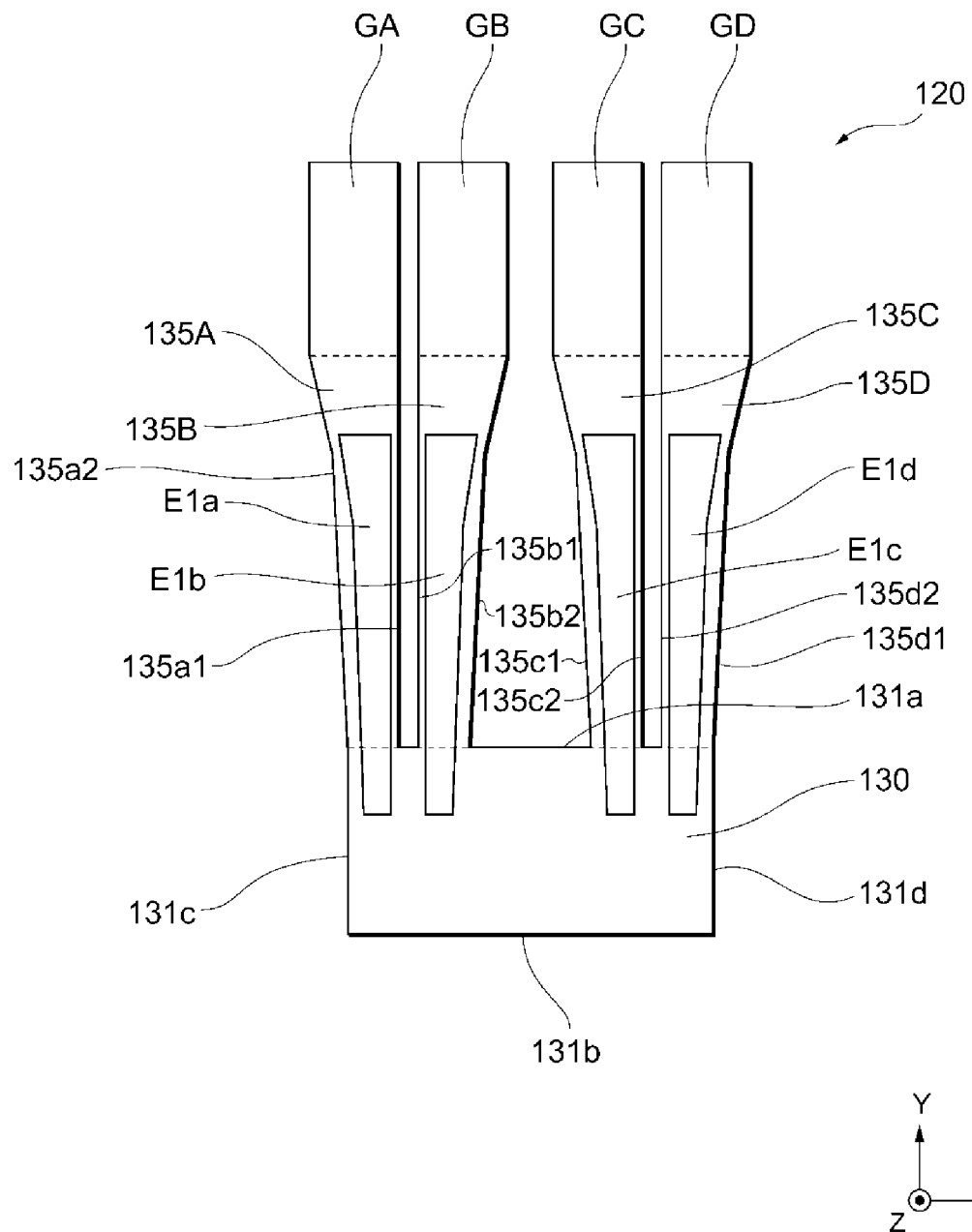
FIG. 6 is a plan view, corresponding to FIG. 3, of a resonator according to a second exemplary embodiment from which the upper cover is removed.

FIG. 6 is a plan view of a vibration portion 120 according to another exemplary embodiment. Hereinafter, specific structures of a resonation device 1 according to the present embodiment that differ from those of the first embodiment will be mainly described.

In the present embodiment, the long side 135a1 of the vibration arm 135A is substantially perpendicular to the X-axis direction. The long side 135a2 is formed so as to be exponentially distanced from the long side 135a1 with increasing distance from the fixed end. As a result, the long side 135a2 has a curved shape. The curvature of the long side 135a2 decreases toward the free end of the vibration arm 135A. In the present embodiment, the long side 135b1 of the vibration arm 135B is substantially perpendicular to the X-axis direction. The long side 135b2 is formed so as to be exponentially distanced from the long side 135b1 with increasing distance from the fixed end. As a result, the long side 135b2 has a curved shape. The curvature of the long side 135b2 decreases toward the free end of the vibration arm 135B. Since the vibration arms 135A and 135B have curved long sides 135a2 and 135b2 as described above, the rigidity of the vibration arms 135A and 135B can be reduced. Therefore, while maintaining a desired frequency, the length of each of the vibration arms 135A and 135B can be reduced, and the size of the resonation device 1 can be reduced. The vibration arms 135C and 135D have structures and advantages that are the same as those of the vibration arms 135A and 135B. Other structures and advantages are the same as those of the first embodiment.

Third Embodiment

In the third to fifth exemplary embodiments, descriptions of matters common to the first exemplary embodiment will be omitted, and differences from the first exemplary embodiment will only be described. In particular, similar advantages due to similar structures will not be specifically described in each of the embodiments.

Figure 7:
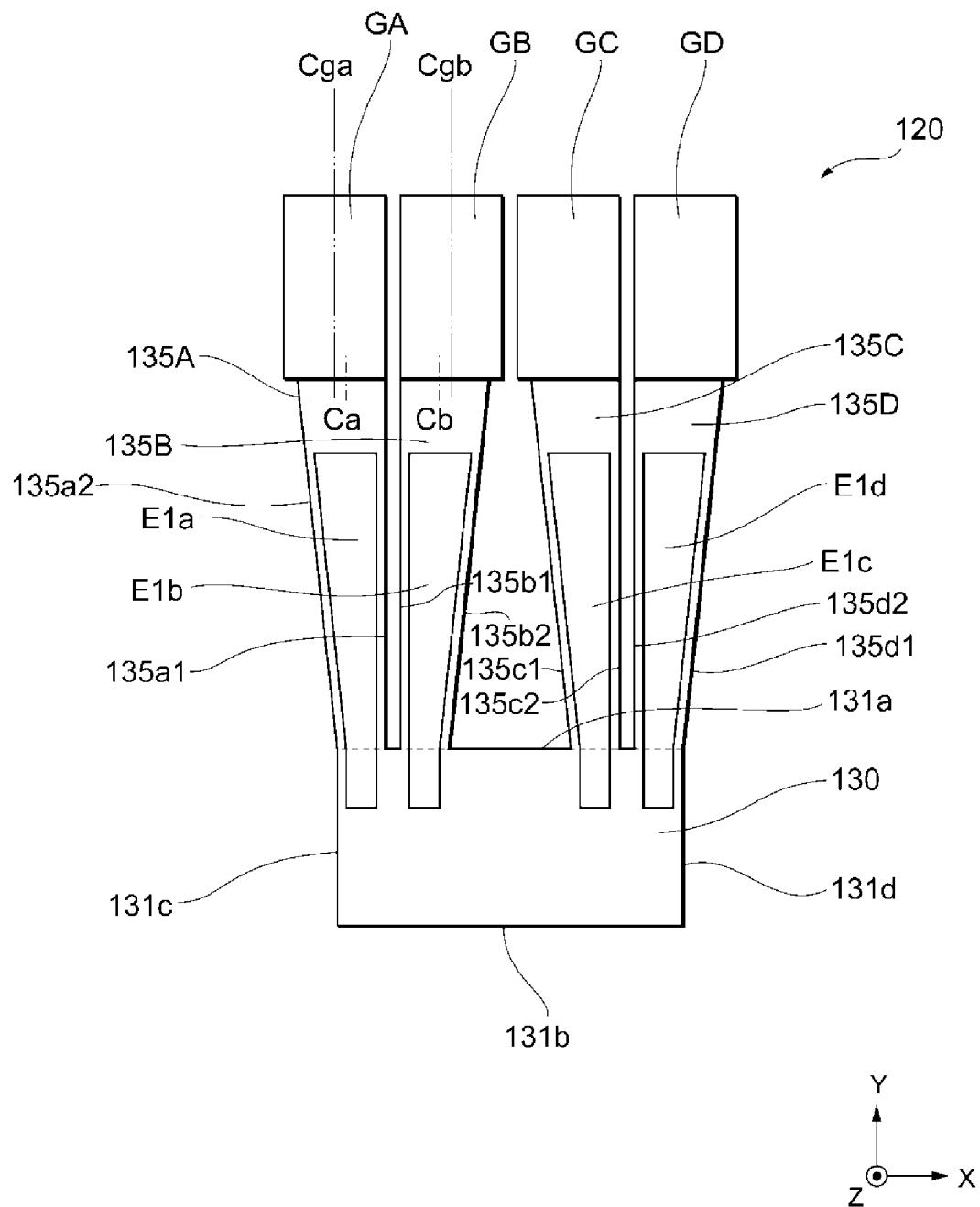
FIG. 7 is a plan view, corresponding to FIG. 3, of a resonator according to a third exemplary embodiment from which the upper cover is removed.

Thus, FIG. 7 is a plan view of a vibration portion 120 according to another exemplary embodiment. Hereinafter, specific structures of a resonation device 1 according to the present embodiment that differ from those of the first embodiment will be mainly described.

In the present embodiment, the width of each of the weight portions GA and GB in the X-axis direction is greater than the width of the free end of a corresponding one of the vibration arms 135A and 135B in the X-axis direction. The center line Cga of the weight portion GA in the X-axis direction is located closer to the long side 135a2 than the center line Ca of the free end of the vibration arm 135A is. As a result, a side of the weight portion GA facing the weight portion GB substantially coincides with an extension line of the long side 135a1, and a side of the weight portion GA facing the frame member 140c is located outside of the vibration arm 135A (long side 135a2) at the free end of the vibration arm 135A.

The center line Cgb of the weight portion GB in the X-axis direction is located closer to the long side 135b2 than the center line Cb of the free end of the vibration arm 135B is. As a result, a side of the weight portion GB facing the weight portion GA substantially coincides with an extension line of the long side 135b1, and a side of the weight portion GB facing the weight portion GC is located outside of the vibration arm 135B (long side 135b2) at the free end of the vibration arm 135B.

By disposing the weight portions GA and GB respectively closer to the long sides 135a2 and 135b2 than the centers of the free ends of the vibration arms 135A and 135B are, the distance between the vibration arm 135A and the vibration arm 135B can be maintained to be small even when the widths of the weight portions GA and GB are increased. The weight portions GC and GD have structures and advantages that are the same as those of the weight portions GA and GB and will not be repeated herein. Other structures and advantages are the same as those of the first embodiment.

Fourth Embodiment

Figure 8:
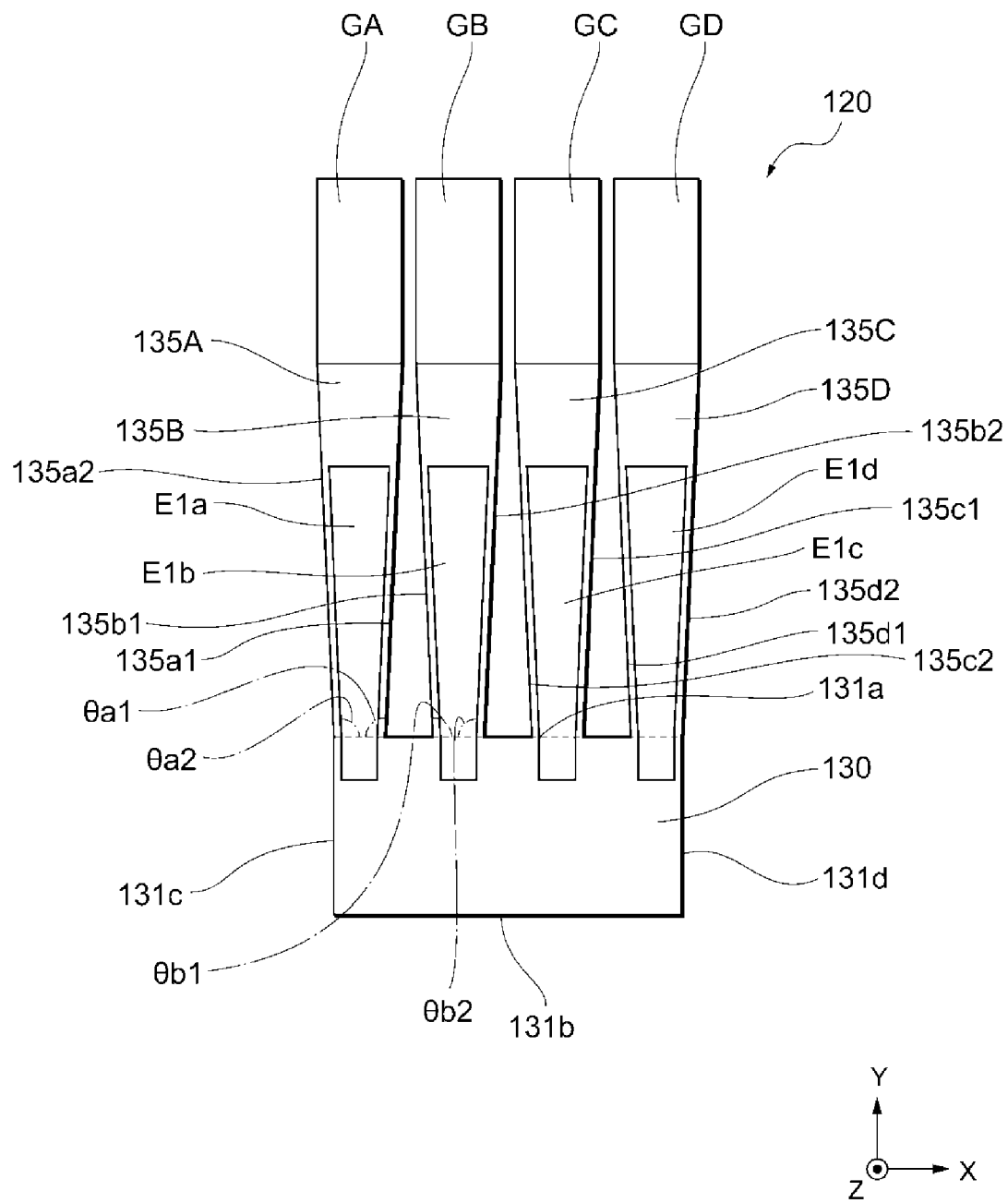
FIG. 8 is a plan view, corresponding to FIG. 3, of a resonator according to a fourth exemplary embodiment from which the upper cover is removed.

FIG. 8 is a plan view of a vibration portion 120 according to another exemplary embodiment. Hereinafter, specific structures of a resonation device 1 according to the present embodiment that differ from those of the first embodiment will be mainly described.

In the present embodiment, the angle θa1 between the long side 131a of the base 130 and the long side 135a1 of the vibration arm 135A is substantially equal to the angle θa2 between the long side 131a and the long side 135a2 of the vibration arm 135A. In other words, the inclination of the long side 135a1 relative to the X axis is the same as the inclination of the long side 135a2 relative to the X axis. The angle θb1 between the long side 131a of the base 130 and the long side 135b1 of the vibration arm 135B is substantially equal to the angle θb2 between the long side 131a and the long side 135b2 of the vibration arm 135B. In other words, the inclination of the long side 135b1 relative to the X axis is the same as the inclination of the long side 135b2 relative to the X axis. The vibration arms 135C and 135D have structures and advantages that are the same as those of the vibration arms 135A and 135B. Other structures and advantages are the same as those of the first embodiment.

Fifth Embodiment

Figure 9:
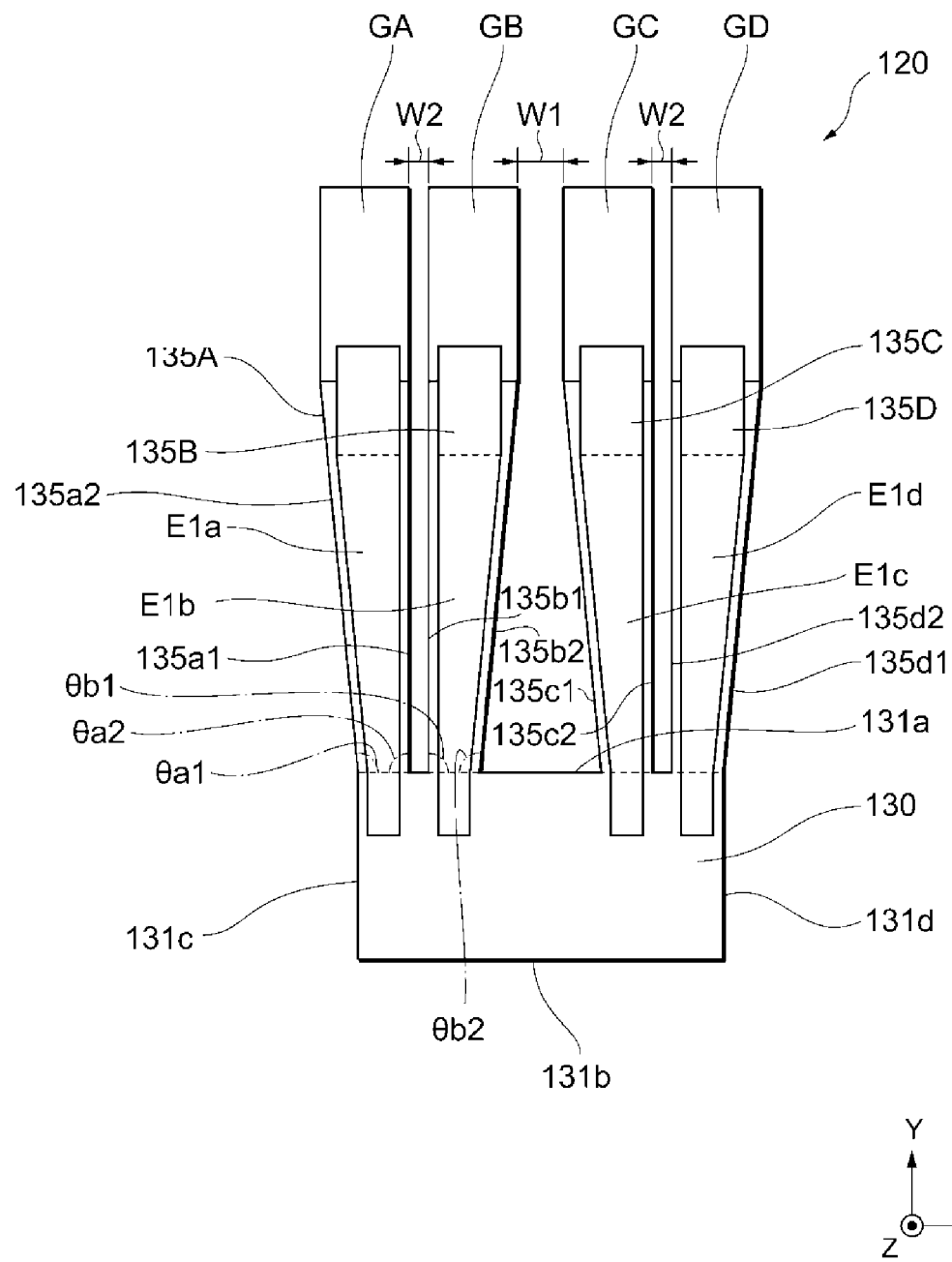
FIG. 9 is a plan view, corresponding to FIG. 3, of a resonator according to a fifth exemplary embodiment from which the upper cover is removed.

FIG. 9 is a plan view of a vibration portion 120 according to another exemplary embodiment. Hereinafter, specific structures of a resonation device 1 according to the present embodiment that differ from those of the first embodiment will be mainly described.

In the present embodiment, the width of each of the upper electrodes E1a to E1d in the X-axis direction gradually increases from the fixed end toward the free end of a corresponding one of the vibration arms 135A to 135D, and each of the upper electrodes E1a to E1d has a region having a uniform-width at the tip thereof near the free end. In the example shown in FIG. 9, the width of the region in the X-axis direction is the maximum width of a corresponding one of the upper electrodes E1a to E1d in the X-axis direction. However, the width of the region is not limited to this. Other structures and advantages are the same as those of the first embodiment.

Exemplary embodiments are described above in order to facilitate understanding the present invention and do not limit the scope of the present invention. The present invention may be modified/improved within the gist thereof and the present invention includes the equivalents thereof. In other words, modifications of the embodiments made by persons skilled in the art are included in the scope of the present invention as long as such modifications include the features of the present invention.

For example, the elements of the embodiments, and the dispositions, materials, conditions, shapes, and sizes of the elements are not limited to those described in the embodiments but may be changed as appropriate. For example, in the exemplary embodiments described above, each of the holding arms 110 is bent twice or more, however, the exemplary embodiments should not be so limited. For example, the holding arm 110 may connect the long side 131b of the base 130 and the frame member 140b to each other without being bent at all. For example, the holding arm 110 may connect the long side 131b of the base 130 and the frame member 140c or 140d to each other by being bent only once. In this case, the size of the resonation device 1 can be reduced. It is needless to say that the embodiments are examples and the elements of different embodiments may be partially replaced or combined, and such replacement and combination are also included in the scope of the present invention as long as they include the features of the present invention.

REFERENCE SIGNS LIST 1 resonation device
10 resonator
30 upper cover
20 lower cover
140 holding portion
140a to 140d frame member
110 holding arm
120 vibration portion
130 base
131a, 131b long side
131c, 131d short side
135A to 135D vibration arm

The invention claimed is:

1. A resonator comprising:
a vibration portion including a base and a plurality of vibration arms each having a fixed end connected to the base and a free end opposite the fixed end,
wherein each of the plurality of vibration arms includes a piezoelectric thin film and an electrode stacked on the piezoelectric thin film,
wherein each of the plurality of vibration arms has a width that increases as the respective vibration arm extends from the fixed end towards the free end, and
wherein the electrode of each of the plurality of vibration arms has a width that increases as the respective electrode extends from the fixed end towards the free end of the vibration arm.

2. The resonator according to claim 1, further comprising:
a frame surrounding at least part of the vibration portion; and
at least one holding arm that is disposed between the vibration portion and the frame and that connects the base of the vibration portion to the frame.

3. The resonator according to claim 2, wherein the at least one holding arm comprises a pair of holding arms that each extend from a first side of the frame that faces the free ends of the plurality of vibration arms and are connected to a side of the base of the vibration portion that faces a second side of the frame opposite the first side.

4. The resonator according to claim 1, wherein each of the fixed ends of the plurality of vibration arms are connected to a first side of the base, and the plurality of vibration arms extend in a first direction that is perpendicular to the first side.

5. The resonator according to claim 4, wherein the plurality of vibration arms includes a first arm that has first and second sides that define the width of the first arm, and, from the fixed end towards the free end, a distance by which the first side becomes displaced in a second direction perpendicular to the first direction is smaller than a distance by which the second side becomes displaced in the second direction.

6. The resonator according to claim 5, wherein the plurality of vibration arms includes a second arm adjacent to the first arm that has a third side and a fourth side that define the width of the second arm, and, from the fixed end towards the free end, a distance by which the third side becomes displaced in the second direction is smaller than a distance by which the fourth side becomes displaced in the second direction.

7. The resonator according to claim 6, wherein the first side of the first arm faces the third side of the third arm.

8. The resonator according to claim 7, wherein a distance between the first side of the first arm and the third side of the second arm is uniform from the fixed ends of the first arm and the second arm to the free ends of the first arm and the second arm.

9. The resonator according to claim 1, wherein each of the plurality of vibration arms comprises first and second sides that define the width of the respective vibration arm.

10. The resonator according to claim 9, wherein a first angle between the first side of each vibration arm and the base of the vibration portion is less than a second angle between the second side of each vibration arm and the base of the vibration portion.

11. The resonator according to claim 1, wherein each of the plurality of vibration arms comprises a mass at the respective free arm of the vibration arm, with a center axis of the mass being offset from a center axis of the respective vibration arm.

12. A resonator comprising:
a base; and
a plurality of vibration arms extending from the base in a first direction, with each vibration arm having a width extending in a second direction perpendicular to the first direction,
wherein the width of each of the plurality of vibration arms increases as the respective vibration arm extends away from the base of the resonator.

13. The resonator according to claim 12,
wherein each of the plurality of vibration arms has a fixed end coupled to the base and a free end opposite the fixed end,
wherein each of the plurality of vibration arms includes a piezoelectric thin film and an electrode stacked on the piezoelectric thin film, and wherein the electrode of each of the plurality of vibration arms has a width that increases as the respective electrode extends from the fixed end towards the free end of the vibration arm.

14. The resonator according to claim 13, wherein each of the fixed ends of the plurality of vibration arms are connected to a first side of the base, and the plurality of vibration arms extend in the first direction that is perpendicular to the first side of the base.

15. The resonator according to claim 14, wherein the plurality of vibration arms includes a first arm that has first and second sides that define the width of the first arm, and, from the fixed end towards the free end, a distance by which the first side becomes displaced in the second direction is smaller than a distance by which the second side becomes displaced in the second direction.

16. The resonator according to claim 15, wherein the plurality of vibration arms includes a second arm adjacent to the first arm that has a third side and a fourth side that define the width of the second arm, and, from the fixed end towards the free end, a distance by which the third side becomes displaced in the second direction is smaller than a distance by which the fourth side becomes displaced in the second direction.

17. The resonator according to claim 16, wherein the first side of the first arm faces the third side of the third arm.

18. The resonator according to claim 17, wherein a distance between the first side of the first arm and the third side of the second arm is uniform from the fixed ends of the first arm and the second arm to the free ends of the first arm and the second arm.

19. A resonator comprising:
a base; and
a plurality of vibration arms extending from the base in a first direction,
wherein each of the plurality of vibration arms includes a first side and a second side that define a width of the respective vibration arm, with the width extending in the second direction perpendicular to the first direction,
wherein respective first sides of a pair of the plurality of vibration arms are parallel to each other as the pair of vibration arms extend from the base, and
wherein respective second sides of the pair of vibration arms are not parallel to each other as the pair of vibration arms extend from the base.

20. The resonator according to claim 19, wherein the width of each of the plurality of vibration arms increases as the respective vibration arm extends away from the base of the resonator.

* * * * *